Dec. 7, 1965 J. J. AMODEI 3,222,542
THRESHOLD CIRCUIT EMPLOYING NEGATIVE RESISTANCE DIODE AND DEVICE HAVING PARTICULAR VOLT-AMPERE CHARACTERISTIC
Filed March 1, 1962 3 Sheets-Sheet 1
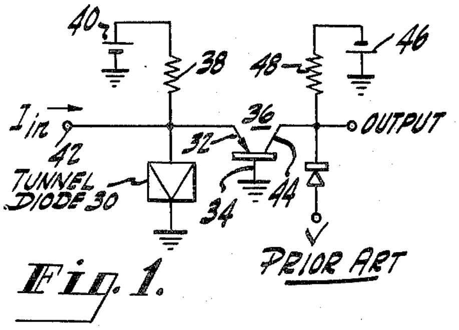
FIG. 1.
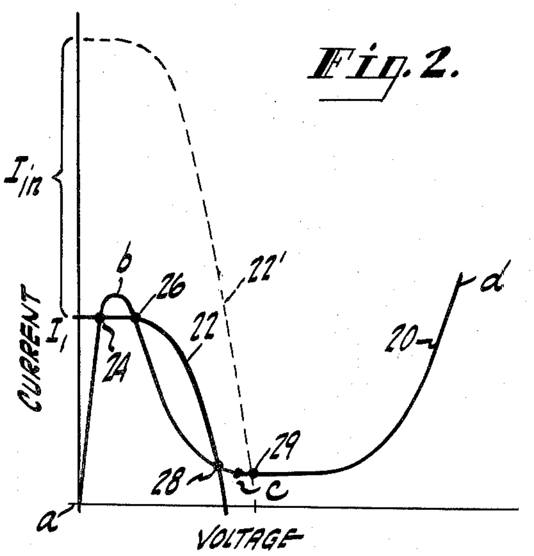
FIG. 2.
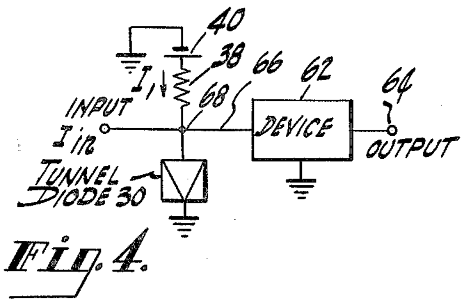
FIG. 4.
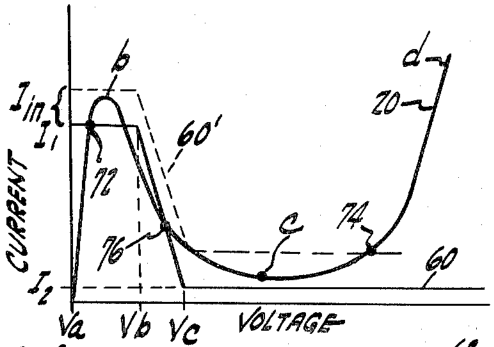
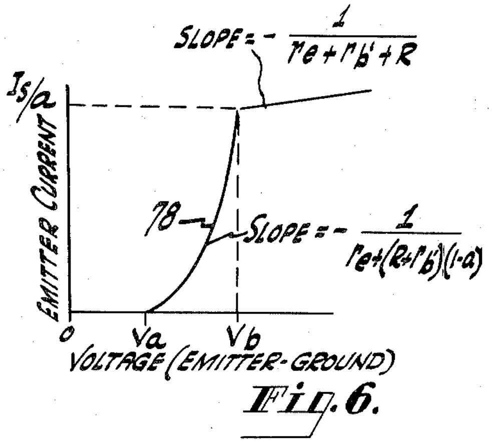
FIG. 6.
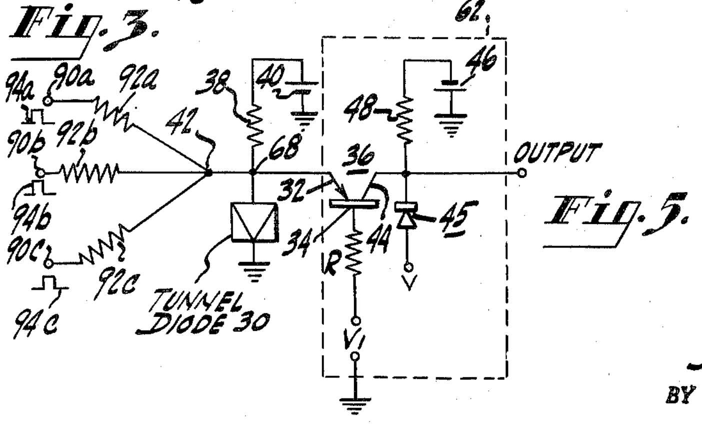
FIG. 3, FIG. 5.
INVENTOR.
JUAN J. AMODEI
BY John V. Regan
Attorney INVENTOR.
JUAN J. AMODEI
BY John V. Regan
Attorney INVENTOR.
JUAN J. AMODEI
BY John V. Regan
Attorney United States Patent Office 3,222,542
Patented Dec. 7, 1965

3,222,542

THRESHOLD CIRCUIT EMPLOYING NEGATIVE RESISTANCE DIODE AND DEVICE HAVING PARTICULAR VOLT-AMPERE CHARACTERISTIC

Juan J. Amodei, Levittown, Pa., assignor to Radio Corporation of America, a corporation of Delaware Filed Mar. 1, 1962, Ser. No. 176,706
19 Claims. (Cl. 307—88.5)

This invention relates to threshold circuits suitable for performing various logical operations in an information handling system.

It has been suggested that negative resistance diodes, tunnel diodes in particular, be used as the active elements in threshold circuits. These devices are capable of high speed switching and current gain and have well-defined thresholds. However, the devices essentially have very limited voltage swing and, because they have common input and output terminals, means must be provided to assure unidirectionality of information flow and any required voltage gain.

Among the schemes proposed for obviating the latter disadvantages are various "hybrid" arrangements of negative resistance diodes and transistors. The transistor provides voltage gain and unidirectionality, as well as other advantages in the combination. It has been found that in most proposed arrangements, monostable circuits in particular, the tolerance requirements of the components are critical, and the temperature must be closely controlled if practical current gains and operating reliability are to be realized. Also, proper circuit operation often requires careful control of the waveshapes of the input signals.

The aforementioned limitations are overcome according to my invention by connecting the negative resistance diode in circuit with a device whose volt-ampere characteristic is characterized by a first region of relatively low and substantially constant current over a first range of voltage values, a second region of relatively high and virtually constant current over a second range of voltage values, and a third, intermediate region wherein the voltage is fairly constant for a wide range of currents. The impedance of the device is very high, relative to the resistance of the diode, in the first and second regions, and may be comparable in magnitude to the negative resistance of the diode, in the third region. For operation as a monostable circuit, the circuit is biased quiescently so that the static volt-ampere characteristic of the device, when superimposed on the diode operating characteristic, intersects the diode operating characteristic in only one of its positive resistance regions. For bistable operation, the circuit is biased quiescently so that the static volt-ampere characteristic of the device intersects the diode operating characteristic in both of its positive resistance regions.

The device preferably includes a transistor having means connected to its output electrode for fixing the output saturation current. The desired operating characteristic is provided according to one embodiment of the invention by connecting an element of high resistance in series with the common electrode of the transistor for effecting a sharp break in the volt-ampere characteristic when the transistor saturates. In accordance with other embodiments of the invention, a source of current of approximately $I_s/\beta_{min}$ is connected to the common electrode and poled in a direction to supply forward transistor current, where $I_s$ is the output saturation current aforementioned, and $\beta_{min}$ is the minimum beta of the transistor to be used. A conventional diode, a tunnel diode or a tunnel rectifier is connected to the common electrode and poled to conduct current in the forward direction from the current source.

In the accompanying drawing, like reference numerals refer to like components, and:

FIGURE 1 is a schematic drawing of a prior art tunnel diode-transistor circuit;

FIGURE 2 is a typical volt-ampere characteristic for a tunnel diode useful in explaining the operation of the FIGURE 1 circuit;

FIGURE 3 is a diagram of a tunnel diode operating characteristic and a load line having the desired shape according to the invention;

FIGURE 4 is a schematic diagram, partially in block form, of a generalized circuit having the desired operating characteristics;

FIGURE 5 is a schematic diagram of one form of the invention;

FIGURE 6 is a static volt-ampere characteristic of the transistor input of FIGURE 5;

Figure 7:
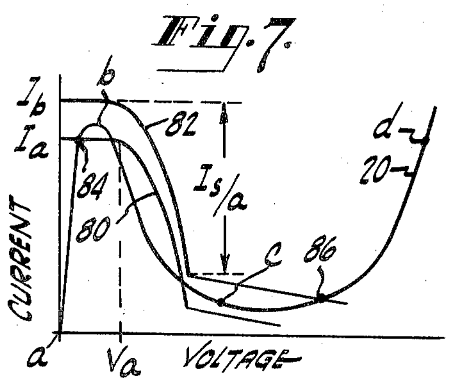
FIGURES 7 and 8 are operating characteristics useful in describing the operation of the FIGURE 5 circuit.

The present invention contemplates the use of a negative resistance diode as a threshold element in circuits performing various logical operations in an information handling system. Such elements may be used to perform various gating operations at very high speeds. In particular, the diode may be a tunnel diode. Tunnel diodes have well-defined thresholds which make these devices advantgeous in circuits performing the logical "and" or "or" functions. Tunnel diodes and their characteristics are well known and are described in various publications. Only those characteristics of a tunnel diode which are important to an understanding of the invention will be described here.

The characteristic of current versus voltage for a typical tunnel diode is illustrated at 20 in FIGURE 2. As is well understood, the operating characteristic of a tunnel diode has two positive resistance operating regions *ab* and *cd* and a region *bc* of negative resistance separating the two positive resistance regions.

One prior art form of threshold circuit employing tunnel diodes is illustrated in FIGURE 1. The tunnel diode 30 has its anode and cathode directly connected to the emitter 32 and base 34 of a PNP transistor 36. The tunnel diode is energized from a source of substantially constant current comprising a resistor 38 and a battery 40, serially connected between the anode of the tunnel diode 30 and a point of substantially constant reference potential, indicated schematically by the conventional symbol for circuit ground. Input signals, as indicated, are applied at an input terminal 42 which is connected to the anode of the diode 30. The collector electrode 44 is biased in the reverse direction relative to the base 34 by a battery 46. The positive terminal of the battery 46 is grounded and the negative terminal is connected to the collector electrode 44 by a resistor 48.

The tunnel diode 30, as described previously, is capable of providing current gain in response to applied input signals. In addition, the tunnel diode 30 may be switched at very high speed. It is to be noted, however, that the tunnel diode 30 has common input and output terminals and, for this reason among others, the transistor is included in the circuit to insure unidirectionality of information flow. The transistor 36 also provides voltage gain. The transistor 36 and its related components act as a load on the tunnel diode 30. The solid curve 22 of FIGURE 2 is the inverted volt-ampere characteristic of the transistor 36, looking between the emitter 32 and ground, with no input signal applied. This curve 22 intersects the ordinate at a current value of $I_1$, the current supplied by the substantially constant current source comprising the battery 40 and the resistor 38. This curve 22 intersects the positive resistance region *ab* at a point 24, and intersects the negative resistance region *bc* at points 26 and 28. The circuit operates monostably, and the quiescent, stable operating state is defined by the point 24, when the dynamic switching impedance of the transistor 36 at high frequency is greater in magnitude than the resistance of the diode 30 in the negative resistance region *bc*. Monostable type of operation is preferred in some applications because the circuit resets automatically at the termination of the input signals, thus obviating the need for a separate reset pulse source.

Two other conditions must be satisfied for proper circuit operation. For operation as an "or" gate, a single input signal must supply sufficient current to the diode 30 to exceed a current value corresponding to the peak *b*. The threshold of the circuit is chosen in accordance with the input signal magnitude by adjusting the current $I_1$. Secondly, the input current must be sufficient to raise the load line 22 to a position, line 22' for example, where it intersects only the portion *cd* of the characteristic 20. For the conditions given in FIGURE 2, this means that the input current must be greater than the bias current $I_1$, because of the steepness of the characteristic 22. The current gain is then less than two, and the number of loads capable of being driven by the transistor 36 is severely limited.

It is believed apparent that operation of the FIGURE 1 circuit as an "and" gate is quite impractical. A combined input current $I_{in}$ is required when all inputs are present. When some, but less than all, inputs are present, the load line (not shown) intersects only the negative resistance region *bc* and the circuit may oscillate. Moreover, operation of the circuit close to the transition point *c* between the negative resistance region *bc* and the positive resistance region *cd* is highly undesirable. This region is not well defined. Any change in temperature of the transistor 36 affects the slope of the curve 22 and tends to shift the curve 22 to the left or right. The tolerances on the circuit components are critical, and replacement of the transistor 36 by one not having identical properties may render the circuit unstable.

Improved operating results are achieved by replacing the transistor 36 circuit with a device having a volt-ampere characteristic of the general shape illustrated by the solid curve 60 of FIGURE 3. The circuit may take the form illustrated schematically in FIGURE 4. In FIGURE 4, the device 62 has first and second terminals connected to different electrodes of the tunnel diode 30. The device 62 also may have an output terminal 64. The volt-ampere characteristic looking between the input terminal 66 of the device 62 and ground may be defined as one having a first region of relatively low and substantially constant current, zero in this case, for a first range of voltage values $V_a$ to $V_b$, a second region of relatively high and substantially constant current in a second range of voltage values greater than $V_c$ and a third, intermediate region of substantially constant voltage, the region $V_b$ to $V_c$, wherein the current may vary over a wide range. In FIGURE 3 by way of example, and depending on the type of tunnel diode 30, $I_1$ may be approximately 8 milliamperes, $I_2$ may be approximately 1 milliampere and $V_b$ and $V_c$ may be approximately 100 and 150 millivolts, respectively. The resistance of the device 62 is very high relative to the resistance of the tunnel diode 30 in the first and second regions aforementioned, and is comparable in magnitude to the negative resistance of the diode 30 in the third or intermediate region.

Consider now the operation of the FIGURE 4 circuit. The constant current source supplies a quiescent bias current $I_1$ to the junction 68 at the anode of the diode 30. The device 62 then is substantially nonconducting and the current $I_1$ flows into the tunnel diode 30 almost in its entirety. The diode 30 is biased quiescently at the stable operating point 72 (FIGURE 3). An input current $I_{in}$ raises the load line to the position indicated by the dashed curve 60'. The diode 30 is switched to the positive resistance region *cd* when the diode current exceeds a value corresponding to the peak *b*. The dynamic switching characteristic is not illustrated in FIGURE 3. Suffice it to say, however, that the circuit stabilizes at the operating point 74 in the region *cd* while the input signal is applied.

It should be noted, in contrast to the FIGURE 2 operating characteristic, that the operating point 74 is well defined and is well into the positive resistance region *cd* for a comparatively small increment of input current $I_{in}$. When the input current $I_{in}$ is removed the load line drops to the original position indicated by curve 60 and the circuit operating point returns from point 74 to point 72. In order that the circuit be truly monostable, it is necessary that the switching behavior of the device 62 meet a further condition that will insure that the combination will never remain or oscillate about the point 76 when the input pulse is removed. This condition is fulfilled when the dynamic impedance of the device 62 is greater in magnitude than the negative resistance of the diode 30.

One embodiment of the invention which has a load line approximating the characteristic 60 of FIGURE 3 is illustrated schematically in FIGURE 5. A resistor R is connected in series with the transistor base 34 to obtain a sharp break in the emitter input characteristic when the transistor 36 reaches saturation. The volt-ampere characteristic 78 of the transistor 36, looking between emitter 32 and ground, is illustrated in FIGURE 6. The emitter current is substantially zero when emitter 32 voltage is less than $V_a$. The value of $V_a$ is determined primarily by the value of the bias voltage source $V_1$ connected between ground and the free end of the resistor R. The transistor 36 is in the active region when the emitter-to-ground voltage lies within the voltage range $V_a$ to $V_b$. The effect of the base resistor R on the characteristic 78 in the active region of the transistor 36 is reduced by a factor of $(1-\alpha)$, where $\alpha$ is the common base, short-circuit current gain of the transistor, commonly referred to as alpha. The alpha drops to zero when the transistor 36 reaches saturation, and the slope of the characteristic 78 then is determined primarily by the value of R and $r_b'$, the internal base resistance. The slope of the characteristic 78 for emitter-to-ground voltages greater than $V_b$ may be made almost horizontal, virtually as a constant current line, by proper choice of the resistor R. The emitter current at saturation is $I_s/\alpha$, where $I_s$ is the collector 44 saturation current. The value of $I_s$ may be fixed at a desired level by proper choice of the collector resistor 48 and battery 46.

The characteristic of FIGURE 6 may be inverted and superimposed as a load line on the tunnel diode operating characteristic 20, as shown in FIGURE 7. In FIGURE 7, two different load lines 80 and 82 are illustrated, corresponding respectively to currents $I_a$ and $I_b$ supplied at the junction 68 of the circuit. Assume first that the battery 40 and resistor 38 serve as a current source to supply a current $I_a$ at the junction 68. Assume further that no current flows through the input resistors 92*a* . . . 92*c* in the quiescent state. The quiescent operating point of the circuit then is the point 84 of FIGURE 7. All of the current $I_a$ flows into the tunnel diode 30 at this time; no current flows into the emitter 32 since the emitter-to-ground voltage is less than $V_a$ volts. The output voltage at the collector 44, in the "off" condition of the transistor 36, may be clamped to a desired voltage V by connecting a diode 45 between the collector 44 and a source of potential, designated V.

An increment of current $I_b-I_a$ applied at the junction 68 raises the load line 80 to the position illustrated by the curve 82. The current through the diode 30 increases to a value corresponding to the peak *b*, whereupon the tunnel diode 30 switches rapidly through its negative resistance region to the point 86 of intersection of the load line 82 with the characteristic 20. The circuit remains in this state until the input signal is removed. The current flowing into the tunnel diode 30 in this state has a value corresponding to that of the point 86. The current into the emitter 32 is equal to $I_b$ less the tunnel diode current. Of the latter quantity, a current $I_s$, equal to the collector saturation current, flows to the collector 44. The remainder flows into the base 34 and through the resistor R. The circuit returns to the stable operating point 84 in the region *ab* at the termination of the input signal.

Three separate input terminals 90*a* . . . 90*c* are illustrated in FIGURE 5. These input terminals 90*a* . . . 90*c* are connected to the common junction 68 by means of input resistors 92*a* . . . 92*c*, respectively, and positive input signals are applied selectively at the input terminals 90*a* . . . 90*c*. The threshold of the circuit is determined by the bias current $I_a$ in accordance with the logical operation to be performed. Decreasing the bias current has the effect of shifting the quiescent load line 80 in a downward direction and increasing the threshold. Increasing the current has the opposite effect. The circuit may be operated as an "or" gate by adjusting the quiescent current $I_a$ so that a single input, for example input pulse 94*a*, supplies sufficient current to the junction 68 to raise the load line above the peak *b*. The circuit may be operated as an "and" gate by adjusting the value $I_a$ so that all three input signals 94*a* . . . 94*c* must be present to raise the load line above the peak *b*.

The circuit also may be operated as an "or" or an "and" gate for negative input signals (not shown) by adjusting the quiescent current supplied by the battery 40 and resistor 38 so that the quiescent load line intersects the positive resistance region *cd*. For example, the quiescent bias current may have a value $I_b$. The quiescent operating point then is the point 86, and the transistor 36 is saturated in the quiescent condition. The diode 30 is switched to the high conduction state, and the transistor turned off, during the application of a negative input current having a magnitude $I_a-I_b$. The switching speed of the transistor 36 may be enhanced by connecting a capacitor (not shown) between the base 34 and ground.

The external resistor R may be, in certain instances, the resistance of the transistor itself. For example, the transistor 36 may have a very thin base layer, resulting in a very high value of $r_b'$ which provides the same effect as the external resistor R.

Figure 8:
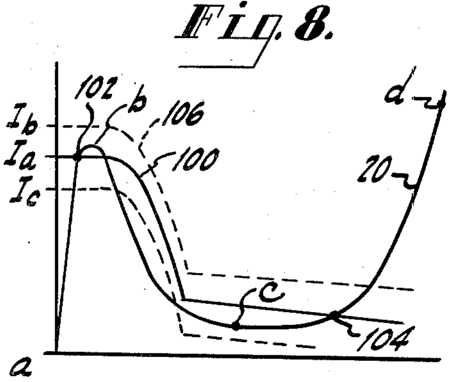

As mentioned previously, the collector saturation current $I_s$ may be predetermined by properly selecting the value of the collector supply resistor 48. Increasing the value of this resistor 48 has the effect of decreasing the value of the saturation current $I_s$, and the value $I_s/\alpha$, thus shrinking the distance between the top and bottom of the volt-ampere characteristic 78 of FIGURE 6. The FIGURE 5 circuit may be operated bistably by choosing the collector saturation current $I_s$ so that the volt-ampere characteristic, when superimposed on the tunnel diode characteristic 20, intersects the characteristic 20 in both positive resistance regions, as illustrated in FIGURE 8 by the solid curve 100.

Assume that the quiescent current supplied at the junction 68 (FIGURE 5) has the value $I_a$. The circuit then may operate stably either at point 102 (FIGURE 8) in the region *ab* or the point 104 in the region *cd*, depending on prior input conditions. Assume that the circuit is operating at the point 102. An increment of positive input current $I_b-I_a$ applied at the junction 68 shifts the load line in an upward direction to a position indicated by the dashed curve 106, and the tunnel diode 30 switches rapidly through its negative resistance region. The circuit stabilizes at the operating point 104 at the termination of the input pulse. The transistor 36 is saturated at this time and the voltage at the output terminal is at its most positive level. A negative input signal having a magnitude $I_c-I_a$ applied at the junction 68 reduces the diode 30 current below a value corresponding to the point *c*, whereupon the diode 30 switches back through the negative resistance region, coming to rest in the region *ab*. The operating point stabilizes at the point 102 at the termination of the negative input signal. All of the current $I_a$ then flows into the diode 30 and little or no current flows into the emitter 32. The voltage at the output terminal then is clamped at a value V volts.

Figure 9:
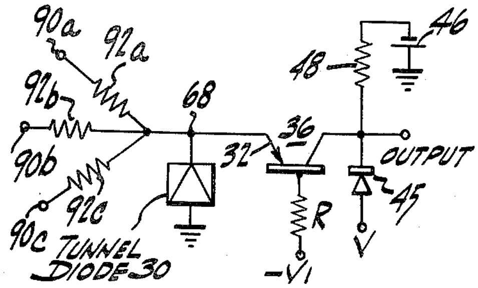
FIGURE 9 is a schematic diagram of a modified form of the FIGURE 5 circuit.
Figure 10:
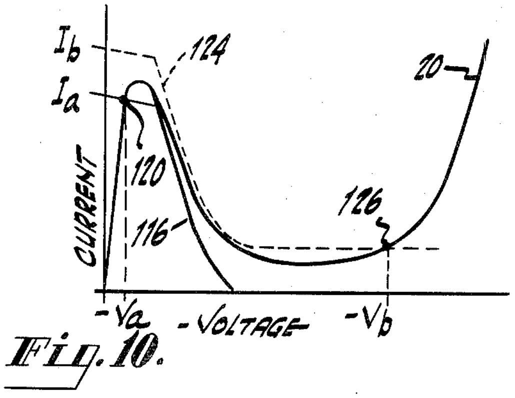
FIGURE 10 is an operating characteristic useful in explaining the operation of the FIGURE 9 circuit.

Due to the substantial symmetry of the transistor volt-ampere characteristic, an inversion about the current axis results in the load characteristic 116, illustrated in FIGURE 10, when the connections to the tunnel diode 30 are reversed, as shown in FIGURE 9. It is to be noted that the constant current source comprising resistor 38 and battery 40 is omitted in the FIGURE 9 circuit. The value of the bias source $V_1$ in the base input circuit is adjusted so that the transistor 36 is in saturation when no input signal is applied at the terminals 90*a* . . . 90*c*. The circuit then is biased quiescently at the point 120 of FIGURE 10. The collector saturation current and the base current flow into the tunnel diode 30. The emitter 32 voltage is $-V_a$ volts with respect to ground for this condition.

Applying a negative increment of current $I_a-I_b$ at the junction 68 has the effect of shifting the load line upward to the position indicated by the dashed curve 124. The diode 30 then switches through the negative resistance region to the point 126 of intersection of the load line 124 with the characteristic 20. The emitter 32 then is $-V_b$ volts relative to ground, and the transistor 36 is biased in the nonconducting condition. The diode switches back through its negative resistance region, and the circuit stabilizes at the operating point 120, at the termination of the negative current input signal.

Figure 11:
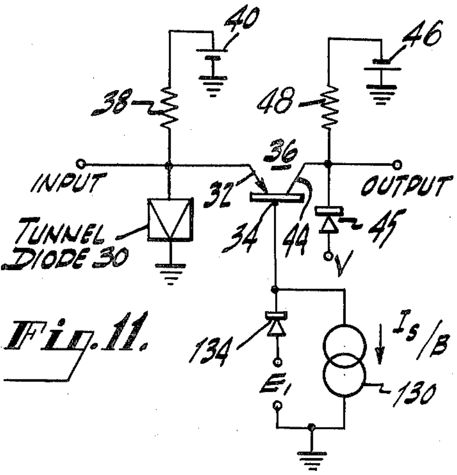
FIGURE 11 is a schematic diagram of another embodiment of the invention.

The portion of the transistor volt-ampere characteristic in the saturated region may be made more nearly horizontal by the arrangement illustrated in FIGURE 11. A substantially constant current source 130 is connected between the base 34 and circuit ground and poled in a direction to supply forward base current. A conventional diode 134 and a voltage source $E_1$ are connected in series between the base 34 and ground. The diode 134 is poled to pass current from the source 130 in its easy current flow direction. It should be noted that the poling of this diode 134 is such that the diode 134 cannot supply forward base current to the transistor 36.

Figure 12:
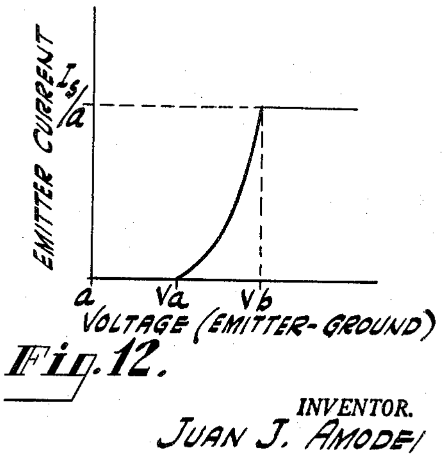
FIGURE 12 is a static volt-ampere characteristic of the transistor input of FIGURE 11.

The characteristic of the transistor looking between emitter 32 and ground is illustrated in FIGURE 12, wherein emitter current is plotted along the ordinate and the voltage between emitter and ground is plotted along the abscissa. The transistor 36 is substantially nonconducting when the emitter 32 voltage is less than $V_a$ volts positive with respect to ground. All of the current supplied by the source 130 flows through the diode 134 when the transistor is nonconducting. The value $V_a$ in FIGURE 12 is determined by the value of bias source $E_1$ in the base circuit. The transistor 36 begins to conduct when the emitter 32 voltage goes more positive than $V_a$ volts. More and more of the current from the source 130 is diverted from the diode 134 to the base 34 as the emitter voltage increases from $V_a$ volts toward $V_b$ volts.

The transistor 36 saturates when the emitter voltage reaches a value of $V_b$ volts. The base 34 current then has a value $I_s/\beta$, where $I_s$ is the collector saturation current and $\beta$ is the beta of the transistor. If the current source 130 is adjusted to supply a constant current $I_s/\beta$, the maximum emitter current then is limited to $$I_s+I_s/\beta=I_s/\alpha$$

and the emitter current remains constant at this value when the emitter 32 voltage is increased above the value $V_b$ volts. The diode 134 in the base circuit is substantially nonconducting when the transistor 36 is in saturation. It is believed unnecessary to describe the operation of the FIGURE 11 circuit since its operation is similar to that of the FIGURE 5 circuit.

In a large system wherein many circuits of the same type are employed, it is customary to "worst"-case design the circuit so as to standardize the component values. The circuits then can be mass produced and only a minimum number of spare parts need be stocked. The betas of the various transistors may vary over a fairly wide range. Inasmuch as it is desired to operate the transistors either in a cutoff condition or in a condition of saturation, it is desirable that the current supplied by the current source 130 be fixed at $I_s/\beta_{min}$ in the "worst"-case design, where $\beta_{min}$ is the lowest beta transistor acceptable. This assures that the minimum beta transistor will saturate in the "on" condition. Setting the value of current supplied by the source 130 at $I_s/\beta$ has a relatively small effect on the maximum emitter current. It can be shown mathematically that the emitter current for any transistor immediately upon saturating is within a few percent of the maximum emitter current for these design conditions.

The diode 134 limits the transistor 36 base turn-on current to the value of the current delivered by the source 130. Enhanced transistor switching speed can be achieved in some cases by connecting a capacitor (not shown) between the base 34 and ground. The capacitor serves as an additional source of charge during transient conditions. Alternatively, a storage diode may be used as the diode 134. A storage diode is one in which the conductivity remains high for an instant after the current flowing through it is reversed, and then drops sharply to zero.

Figure 13:
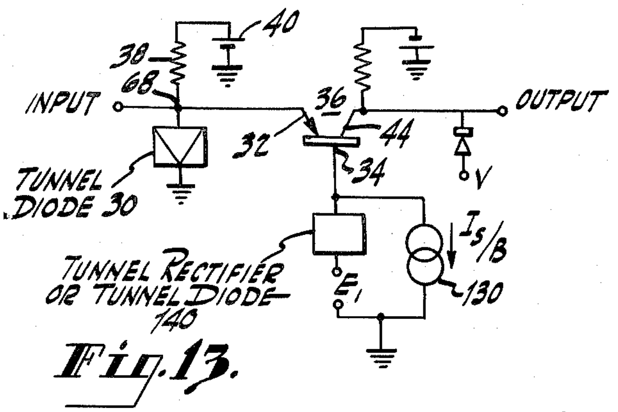
FIGURE 13 is a schematic diagram of still another embodiment of the invention.
Figure 14:
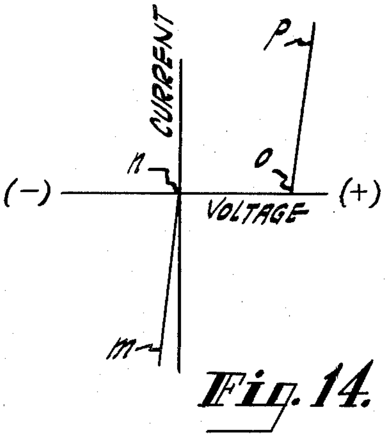
FIGURE 14 is a volt-ampere characteristic of a tunnel rectifier.

A further embodiment of the invention is illustrated schematically in FIGURE 13. This circuit is similar generally to that of FIGURE 11 except that the conventional diode 134 is replaced by a tunnel rectifier 140. In certain cases, a tunnel diode could be used in place of the rectifier 140. Tunnel rectifiers are known in the art and described, for example, in an article in the 1959 IRE Wescon Convention Record, part 3, pages 9–31. The volt-ampere characteristic of a typical tunnel rectifier is illustrated in FIGURE 14. Essentially a tunnel rectifier is a tunnel diode having a peak *b* current of substantially zero. As is the case with a tunnel diode, a tunnel rectifier has a very low impedance when biased in the reverse direction. The tunnel rectifier conducts little or no current when forward biased by a voltage having a value less than that corresponding to the transition point *o*, and conducts heavily for higher voltage values.

Figure 15:
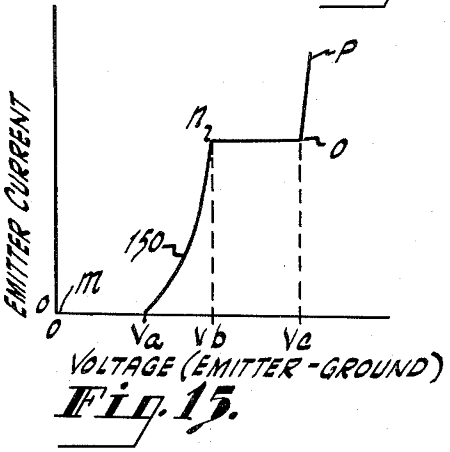
FIGURE 15 is a static volt-ampere characteristic of the transistor input of FIGURE 13.

FIGURE 15 is a volt-ampere characteristic 150 for the transistor 36 of FIGURE 13, looking between the emitter 32 and ground. Certain points on the characteristic 150 are designated by alphabetic characters corresponding to those appearing in FIGURE 14 for purposes of explanation. The tunnel rectifier 140 is poled in the FIGURE 13 circuit so as to conduct current from the current source 130 in the reverse direction. All of the current from the source 130 flows into the tunnel rectifier 140 when the transistor 36 is nonconducting. It is assumed that the point *m* is the operating point for the tunnel rectifier 140 in this condition.

The tunnel rectifier 140 continues to conduct all of the current $I_s/\beta$ from the source 130 until the voltage at the emitter 32 reaches $V_a$ volts. Current is diverted from the rectifier 140 to the base 34 when the emitter 32 voltage exceeds $V_a$. The transistor 36 saturates and all of the current $I_s/\beta$ from the source 130 is applied to the base 34 when the emitter 32 voltage reaches $+V_b$. The tunnel rectifier 140 then is nonconducting, and remains nonconducting until the emitter 32 voltage reaches $V_c$. It is to be noted that the emitter 32 current remains constant over the range $V_b$ to $V_c$ volts because the collector 44 can take no more current and the source 130 is supplying all of its current to the base 34.

The tunnel rectifier 140 is biased at the transition point *o* when the emitter 32 voltage is $V_c$. The rectifier 140 is biased into forward conduction when the emitter voltage rises above $V_c$, and the rectifier current is in a direction to supply forward base current. This latter current flows through the emitter-base diode since the collector 44 is saturated.

Figure 16:
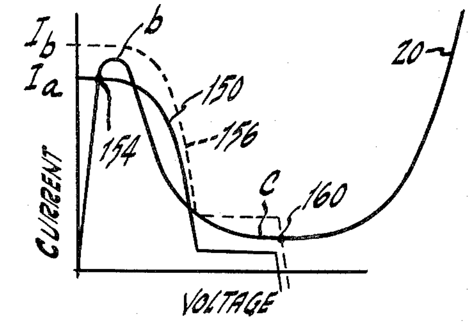
FIGURE 16 is an operating characteristic useful in explaining the operation of the FIGURE 13 circuit.

FIGURE 16 illustrates the tunnel diode 30 characteristic 20 with the transistor input characteristic inverted and superimposed thereon as a load line 150. The load line 150 intersects the current ordinate at $I_a$, the value of current supplied by the battery 40 and resistor 38. The tunnel diode 30 is quiescently biased at the operating point 154. Increasing the diode 30 current above the peak *b* by applying an input signal $I_b$–$I_a$ raises the load line to the position indicated by the dashed curve 156. The latter load line intersects the characteristic 20 at a point 160 in the positive resistance region. The voltage at the output terminal of the transistor 36 is at its most positive value for this condition, and the transistor is saturated. The diode 30 switches back through the negative resistance region to the operating point 154 at the termination of the input pulse. The transistor 36 is nonconducting in the latter condition.

The circuit may perform the "or" or "and" functions in the manner previously described by proper selection of the quiescent bias current $I_a$. It will be understood that the transistor 36 may be operated in a saturated condition quiescently if the quiescent bias current from the source 40 has a value greater than that corresponding to the peak *b*. For example, the dashed curve 156 might be the quescent load line for the diode 30, and negative input signals may be applied at the input to switch the diode 30. The FIGURE 16 circuit has the advantage that the load line 156 intersects the characteristic 20 in the valley region of the characteristic.

Figure 17:
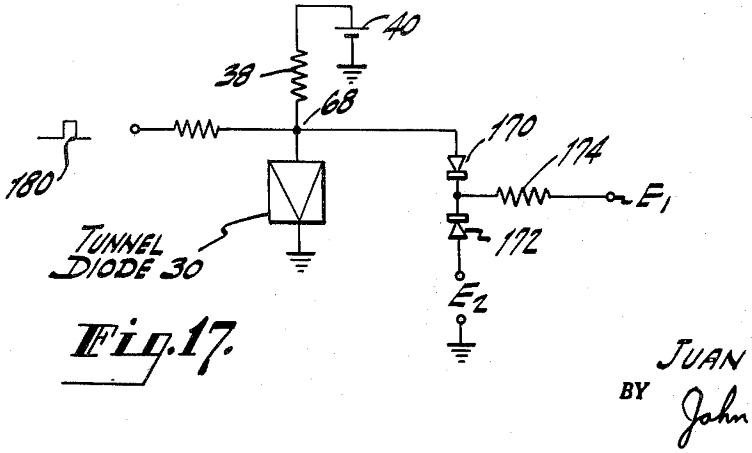
FIGURE 17 is a further embodiment of the invention.

A still further embodiment of the invention is illustrated in FIGURE 17, using a pair of semiconductor diodes. The pair of conventional diodes 170, 172 and a voltage biasing source $E_2$ are connected in series between ground and the anode of the tunnel diode 30. The diodes 170 and 172 are poled back-to-back with their cathodes connected together. A resistor 174 is connected between a voltage source $-E_1$ and the cathodes of the diodes 170, 172. The resistor 174 and voltage source $E_1$ serve as a constant current source. The bias source $E_2$ is chosen in value so that all of the constant current aforementioned flows through the diode 172 when the tunnel diode 30 is biased in the positive resistance region *ab* (FIGURE 2, for example).

A positive input pulse 180 switches the tunnel diode 30 through the negative resistance region. The voltage across the diode 30 increases in a positive direction and forward biases the conventional diode 170. The current supplied by the source $E_1$ and resistor 174 then flows through the diode 170 to the junction 68 at the anode of the tunnel diode. The characteristic for the conventional diode circuitry is similar to that illustrated in FIGURE 12 for the transistor-diode combination.

It will be understood that, although various embodiments of the invention are illustrated as including PNP transistors, this constitutes no limitation on the invention. NPN transistors may be substituted, provided that the polarities of the various voltage and current sources are reversed and provided further that the connections to the tunnel diode, conventional diode and tunnel rectifier are reversed. It should also be understood that the circuit is not limited to the use of tunnel diodes, although such devices are preferred as the threshold element. Other negative resistance diodes having suitable volt-ampere characteristics also may be used in various ones of the embodiments.

What is claimed is:

1. The combination comprising:
a negative resistance diode having a volt-ampere characteristic defined by two regions of positive resistance, extending over first and second ranges of voltage values, respectively, separated by a region of negative resistance;
a device having at least two terminals;
said device having a volt-ampere characteristic defined by a first region of relatively low, constant current over a range of voltage values, which includes one of said first and second ranges, a second region of relatively high, virtually constant current over a range of voltage values which includes the other of said first and second ranges, and a third region of almost constant voltage between said first region and said second region;
means connecting said diode across said terminals;
means for quiescently biasing said diode and said device;
and means for applying input signals to said diode.

2. The combination comprising:
a negative resistance diode having a volt-ampere characteristic defined by two regions of positive resistance, extending over first and second ranges of voltage values, respectively, separated by a region of negative resistance;
a device having at least two terminals, and having a volt-ampere characteristic, as measured between said two terminals, characterized by a first region of substantially constant current over a range of voltage values which includes one of said first and second ranges, a second region of higher and substantially constant current over a range of voltage values which includes the other of said first and second ranges, and a third region of substantially constant voltage intermediate said first region and said second region;
means connecting said diode across said terminals;
and means for quiescently biasing said diode and said device so that the two volt-ampere characteristics, when superimposed, intersect in one of said two regions of positive resistance.

3. The combination comprising:
a negative resistance diode having a volt-ampere characteristic defined by two regions of positive resistance, extending over first and second ranges of voltage values, respectively, separated by a region of negative resistance;
a device having at least two terminals, and having a volt-ampere characteristic, as measured between said two terminals, characterized by a first region of substantially constant current over a range of voltage values which includes one of said first and second ranges, a second region of higher and substantially constant current over a range of voltage values which includes the other of said first and second ranges, and a third region of substantially constant voltage intermediate said first region and said second region;
means connecting said diode across said terminals;
and means for quiescently biasing said diode and said device so that the two volt-ampere characteristics, when superimposed, intersect in only one of said two regions of positive resistance.

4. The combination comprising:
a negative resistance diode having a volt-ampere characteristic defined by two regions of positive resistance, extending over first and second ranges of voltage values, respectively, separated by a region of negative resistance;
a device having at least two terminals and having a volt-ampere characteristic characterized by a first region of substantially constant current over a range of voltage values which includes one of said first and second ranges, a second region of higher and substantially constant current over a range of voltage values which includes the other of said first and second ranges, and a third region of substantially constant voltage intermediate said first region and said second region;
means connecting said diode across said terminals;
means for quiescently biasing said diode and said device so that the two volt-ampere characteristics, when superimposed, intersect in one of said two regions of positive resistance;
and means for applying input signals to said diode.

5. The combination comprising:
a negative resistance diode having a static volt-ampere characteristic defined by two regions of positive resistance, extending over first and second ranges of voltage values, respectively, joined by a region of negative resistance;
a device having at least two terminals, and having a static volt-ampere characteristic with at least three well-defined regions;
said last-mentioned regions including, in the order named, a region of substantially constant current of relatively low value extending over a range of voltages which includes one of said first and second ranges, a region of substantially constant voltage, and a region of relatively high current which extends over a range of voltage values which includes the other of said first and second ranges and which is more nearly one of constant current than constant voltage;
means connecting said diode across said device;
and means for quiescently biasing said diode and said device so that the two volt-ampere characteristics, when superimposed, intersect one another in one only of said two regions of positive resistance.

6. The combination comprising:
a negative resistance diode having a static volt-ampere characteristic defined by two regions of positive resistance, extending over first and second ranges of voltage values, respectively, separated by a region of negative resistance;
a device having at least two terminals, and having a static volt-ampere characteristic defined by a first region of negligible current over a range of voltage values which includes one of said first and second ranges, a second region of relatively high and virtually constant current over a range of voltage values which includes the other of said first and second ranges, and a third region of almost constant voltage between said first region and said second region;
means connecting said diode across said terminals;
and means for quiescently biasing said diode and said device so that the two volt-ampere characteristics intersect one another in one, but not both, of said two regions of positive resistance.

7. The combination comprising:
a negative resistance diode having a volt-ampere characteristic defined by two regions of positive resistance, extending over first and second ranges of voltage values, respectively, separated by a region of negative resistance;
a device having at least two terminals and having a very high resistance, relative to the resistance of said diode, at voltage values lying within one range and another range which include said first and second ranges, respectively, and a resistance comparable in magnitude to that of the diode, in the negative resistance region of the latter, at voltage values intermediate those within said first and second ranges;
means connecting said diode across said terminals;
means for quiescently biasing said diode and said device in a stable operating state;
and means for applying input signals to said diode.

8. The combination comprising:
a negative resistance diode having a volt-ampere characteristic defined by two regions of positive resistance separated by a region of negative resistance;
a transistor having an input electrode, an output electrode and a common electrode;
means connected with said output electrode for fixing the output saturation current of said transistor;
means connected to said common electrode for effectively limiting the current through said common electrode to a relatively constant value when said transistor saturates;
means connecting the two electrodes of said diode to said input electrode and to said current limiting means, respectively;
means quiescently biasing said diode in one of said two positive resistance regions;
and means for applying input signals to said diode.

9. The combination comprising:
a negative resistance diode having a volt-ampere characteristic defined by two regions of positive resistance separated by a region of negative resistance;
a transistor having an input electrode, an output electrode, and a common electrode;
means connected with said output electrode for fixing the output saturation current of said transistor;
means in series with said common electrode for effectively limiting the current through said common electrode to a substantially constant value when said transistor saturates;
means connecting the two electrodes of said diode to said input electrode and to said current limiting means, respectively;
means quiescently biasing said diode for operation in one of said positive resistance regions;
and means for changing the operation point of said diode to the other of said positive resistance regions.

10. The combination comprising:
a negative resistance diode having a volt-ampere characteristic with two regions of positive resistance separated by a region of negative resistance;
a transistor having an emitter, a collector and a base;
means connected with said collector for fixing the collector saturation current;
means in series with said base for effectively limiting the base current to a substantially constant value after said transistor saturates;
means connecting the two electrodes of said diode to said emitter and to said base current limiting means, respectively;
and means for applying input signals to said diode.

11. The combination comprising:
a negative resistance diode having a volt-ampere characteristic with two regions of positive resistance separated by a region of negative resistance;
a transistor having an emitter, a collector and a base;
means connected with said collector for fixing the collector saturation current;
means in series with said base for essentially fixing the base current after said transistor saturates;
means connecting the two electrodes of said diode to said emitter and to said base current limiting means, respectively;
means for quiescently biasing said diode and said transistor for monostable operation;
and means for applying input signals to said diode.

12. The combination comprising:
a negative resistance diode having a volt-ampere characteristic with two regions of positive resistance separated by a region of negative resistance;
a transistor having an emitter, a collector and a base;
means connected with said collector for fixing the collector saturation current;
means in series with said base for effectively limiting the base current to a substantially constant value when said transistor saturates;
means connecting the two electrodes of said diode to said emitter and to said base current limiting means, respectively;
means for applying input signals to said diode;
means for quiescently biasing said diode and said transistor for monostable operation;
and output means connected to said collector.

13. The combination comprising:
a negative resistance diode having a volt-ampere characteristic defined by two regions of positive resistance separated by a region of negative resistance;
a transistor having an emitter, a collector and a base;
means connected with said collector for fixing the collector saturation current at a value $I_s$;
means connected with said base for effectively limiting the maximum base current to a value of approximately $I_s/\beta_{min}$, where $\beta_{min}$ is the minimum beta of the transistor to be used in the combination;
means connecting the electrodes of said diode to said emitter and to said base current limiting means, respectively;
means for quiescently biasing said diode for operation in one of said positive resistance regions;
and input means for changing the current flow through said diode.

14. The combination comprising:
a negative resistance diode having a volt-ampere characteristic defined by two regions of positive resistance separated by a region of negative resistance;
a transistor having an emitter, a collector, and a base;
means connected to said collector for fixing the collector saturation current at a value $I_s$;
a diode having one electrode connected to said base;
means connected to said last-mentioned diode for cutting off current flow therethrough after the collector current reaches a value $I_s$;
means connecting the two electrodes of said negative resistance diode to said emitter and to the other electrode of the base-connected diode, respectively;
and means for applying input signals to said negative resistance diode.

15. The combination comprising:
a negative resistance diode having a volt-ampere characteristic defined by two regions of positive resistance separated by a region of negative resistance;
a transistor having an emitter, a base and a collector;
means connected to said collector for fixing the collector saturation current at a value $I_s$;
a source of current of approximately $I_s/\beta$ connected to said base and poled in a direction to supply forward current to said base, where $\beta$ is the beta of said transistor;
a diode having one electrode connected to said base and being poled to conduct current from said source in the forward direction;
means connecting said emitter and the other electrode of said last-mentioned diode to different electrodes of said negative resistance diode;
and means for applying input signals to said negative resistance diode.

16. The combination comprising:

a negative resistance diode having a volt-ampere characteristic defined by two regions of positive resistance separated by a region of negative resistance;
a transistor having an emitter, a base and a collector;
said transistor having a dynamic impedance greater in magnitude than the resistance of said negative resistance diode in the negative resistance region thereof;
means connected to said collector for fixing the collector saturation current at a value $I_s$;
a source of current of approximately $I_s/\beta$ connected to said base and poled in a direction to supply forward current to said base, where $\beta$ is the beta of said transistor;
a diode having one electrode connected to said base and being poled to conduct current from said source in the forward direction;
means connecting said emitter and the other electrode of said last-mentioned diode to different electrodes of said negative resistance diode;
and means for applying input signals to said negative resistance diode.

17. The combination comprising:
a negative resistance diode having a volt-ampere characteristic defined by two regions of positive resistance separated by a region of negative resistance;
a transistor having an emitter, a collector and a base;
means connected to said collector for fixing the collector saturation current at a value $I_s$;
a source of current of approximately $I_s/\beta_{min}$ where $\beta_{min}$ is the minimum beta of the transistor to be used;
means connecting said current source to said base in a direction to supply forward base current;
a tunnel rectifier having one electrode connected to said base and being poled to conduct current from said source in the easiest current flow direction of said tunnel rectifier;
means connecting said emitter and the other electrode of said tunnel rectifier to different electrodes of said diode;
and means for supplying input signals to said diode.

18. The combination as claimed in claim 17 wherein said transistor has a dynamic input impedance which is greater in magnitude than the average negative resistance of said diode, and output means connected to said collector.

19. The combination as claimed in claim 17 wherein said transistor has a dynamic input impedance which is greater in magnitude than the average negative resistance of said diode, means for quiescently biasing said diode for monostable operation, wherein said diode is quiescently biased in one one of its two said positive resistance regions, and output means connected to said collector.

References Cited by the Examiner

UNITED STATES PATENTS

| | | | |
|---|---|---|---|
| 1,477,017 | 12/1923 | Sprague | 328—143 |
| 2,796,518 | 6/1957 | Schlesinger | 328—142 |

OTHER REFERENCES

Application Engineering Notes, May 1960, Hughes Semiconductor Division, pages 4–5.

1960 International Solid-State Circuits Conference (pages 16–17), Feb. 10, 1960.

RCA TN No. 468, September 1961, "Nondestructive Tunnel Diode Memory Cell," Sheets 3 and 4 of 5.

ARTHUR GAUSS, *Primary Examiner.*